(12) United States Patent
Kim

(10) Patent No.: US 7,400,089 B2
(45) Date of Patent: Jul. 15, 2008

(54) ORGANIC ELECTROLUMINESCENT DISPLAY DEVICE AND METHOD FOR FABRICATING THE SAME

(75) Inventor: Chang Yeon Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 134 days.

(21) Appl. No.: 11/298,669

(22) Filed: Dec. 12, 2005

(65) Prior Publication Data

US 2006/0145601 A1 Jul. 6, 2006

(30) Foreign Application Priority Data

Dec. 30, 2004 (KR) .................... 10-2004-0116613

(51) Int. Cl.
*H01L 51/00* (2006.01)
*G09G 3/30* (2006.01)

(52) U.S. Cl. .................... 313/504; 313/506; 257/72; 257/40

(58) Field of Classification Search ............. 313/504, 313/506; 428/690, 917; 257/72, 40
See application file for complete search history.

(56) References Cited

U.S. PATENT DOCUMENTS

| 7,132,801 | B2* | 11/2006 | Park et al. ............... 315/169.3 |
| 2003/0201445 | A1* | 10/2003 | Park et al. ............... 257/79 |
| 2003/0205763 | A1* | 11/2003 | Park et al. ............... 257/359 |
| 2004/0195959 | A1* | 10/2004 | Park et al. ............... 313/500 |

* cited by examiner

*Primary Examiner*—Karabi Guharay
(74) *Attorney, Agent, or Firm*—Morgan, Lewis & Bockius LLP

(57) ABSTRACT

A dual plate organic electroluminescent display (ELD) device includes a first substrate and a second substrate having a plurality of sub-pixels, a gate line and a data line disposed on a first substrate and crossing to define one of the plurality of sub-pixels, a driving thin film transistor formed in the one of the sub-pixels, a passivation layer formed on the driving thin film transistor, at least two contact spacers formed on the passivation layer, and a connection electrode formed on the at least two contact spacers and connected to a drain electrode of the driving thin film transistor.

12 Claims, 6 Drawing Sheets

ORGANIC ELECTROLUMINESCENT DISPLAY DEVICE AND METHOD FOR FABRICATING THE SAME

This application claims the benefit of Korean Patent Application No. P2004-116613, filed in Korea on Dec. 30, 2004, which is hereby incorporated by reference as if fully set forth herein.

BACKGROUND OF THE INVENTION

1. Field of the Invention

The present invention relates to an electroluminescent display (hereinafter referring to as "ELD"), and more particularly, to an organic ELD display having a dual-plate structure.

2. Background of the Related Art

Recently, a lot of effort has been made to develop flat displays, such as liquid crystal displays (LCDs), field emission displays (FEDs), electroluminescent displays (ELDs), plasma display panels (PDPs), and the like. Among these flat displays, the LCDs have been widely used in personal information devices, such as personal communication service terminals, laptop computers, TVs, and so on. Since the LCD has disadvantages of a narrow viewing angle and slow response time, a self-luminescent organic ELD has attracted considerable attention.

The organic ELD device utilizes an electroluminescence phenomena, in which an electric field is applied to a negative electrode and a positive electrode formed in the upper and lower sides of an organic emitting layer such that electrons and holes are inserted into and transported into the organic emitting layer so that the electrons and holes are coupled with each other and energy generated when the electrons are coupled with the holes is emitted in the form of visible light. In other words, the electrons and the holes form hole-electron pairs, and the hole-electron pairs emit light when dropping from the excited state to the ground state.

The organic ELD device can be driven at a low voltage and display all colors within a visible spectrum. Also, the organic ELD device can satisfy a variety of consumers' tastes because of its advantages of a fast response time, excellent brightness, and thin films. Moreover, the organic ELD device can be implemented on a flexible transparent substrate, such as a plastic. Since the organic ELD device can be driven under the low voltage, exhibit relatively low power consumption and easily display three colors (green, red, and blue colors), it is ideal for use as the next generation flat display.

The organic ELD device is either a passive matrix type or an active matrix type depending on a driving method thereof. The passive matrix type organic ELD device has a simple structure and therefore, a manufacturing method thereof is also simple. However, the organic ELD device has high power consumption, and has limitations in achieving a large sized organic ELD device. Moreover, the more the number of lines, the lower the aperture ratio. On the other hand, the active matrix type organic ELD device has a high luminescent efficiency and provides a high-density resolution. Hereinafter, an active matrix type organic ELD device having a dual plate structure according to the related art will be described in detail with reference to the accompanying drawings.

FIG. 1 is a cross-sectional view illustrating an organic ELD device according to the related art, and FIG. 2 is a cross-sectional view highlighting problems of the organic ELD device of FIG. 1. As shown in FIG. 1, the related art organic ELD device is fabricated by bonding a first transparent substrate 10 and a second transparent substrate 20 together using a sealant (not shown). A plurality of pixels (luminescent parts) P are defined on the first substrate 10, and thin film transistors T and array lines (not shown) are deposited at respective sides of the respective pixels P. Specifically, on the first substrate 10, gate lines are arranged in a single row, data lines and power lines cross each other and are spaced apart from each other by a predetermined interval, switching thin film transistors Ts (not shown) are provided at positions where the gate lines cross the data lines, and driving thin film transistors Tp are provided at positions where the gate lines cross the power lines. Moreover, the switching thin film transistors Ts (not shown) have drain electrodes connected to gate electrodes 12a of the driving thin film transistors Tp. The driving thin film transistors Tp have drain electrodes 15b integrally formed with connection electrodes 41. A set of the gate line, the data line, and the power line defines a sub-pixel, and respective ones of the switching thin film transistors Ts and the driving thin film transistors Tp are provided in the sub-pixel.

On the second substrate 20, first electrodes 21 are formed as transparent hole injection electrodes, insulation layers 31 and separators 32 are disposed at the boundaries of the sub-pixels, organic luminescent layers 22 are formed on the first electrodes 21 between the insulation layers 31 and the separators 32, and second electrodes 23 are formed as electron injection electrodes on the organic luminescent layers 22. The organic luminescent layers 22 and the second electrodes 23 are each formed with separate patterns divided in a unit of the sub-pixel by the insulation layers 31 and the separators 32. The second electrodes 23 are connected to the driving thin film transistors Tp through the connection electrodes 41. Each of the connection electrodes 41 is deposited on the first substrate 10, contacting the second electrode 23 when the first substrate 10 is bonded to the second substrate 20. The connection electrodes 41 contact the second electrodes 23 through contact spacers 42, each of which is formed with a column-shape and a predetermined height between the two substrates to maintain a cell gap.

The organic luminescent layer 22 emits light with colors of red R, green G, and blue B. Generally, separate organic materials for emitting red, green, and blue are patterned in respective pixels. The organic luminescent layer 22 may be either a single layer or multiple layers. If formed with the multiple layers, the organic luminescent layer 22 further includes hole-injection layers and hole-transporting layers disposed near the first electrodes 21, and electron-injection layers and electron-transporting layers disposed near the second electrodes 23. When an electric field is applied to the first electrodes 21 and the second electrodes 23 of the organic ELD device, electrons are injected into the organic luminescent layer 22 from the second electrodes 23, and holes are injected into the organic luminescent layer 22 from the first electrodes 21.

However, the related art organic ELD device and method for fabricating the same has some problems. The related art organic ELD device has the single contact spacer 42 in the sub-pixel, and the connection electrode 41 is formed on the contact spacer 42. As shown in FIG. 2, when patterns 60 (for example, power lines) are further formed under the contact spacer 42 or the insulation layers 61 have uneven thickness, a cell gap of the organic ELD device is uneven. For this reason, when the cell gap in the sub-pixels is uneven, there occurs a problem, indicated by "A" in the drawing, that the connection electrode 41 on the contact spacer 42 does not contact the second electrode 23. In such a situation, the organic luminescent layer cannot be driven.

SUMMARY OF THE INVENTION

Accordingly, the present invention is directed to an organic ELD device and a method for fabricating the same that substantially obviates one or more problems due to limitations and disadvantages of the related art.

An object of the present invention is to provide an organic ELD device having a dual plate structure that is capable of reducing contact resistance.

Another object of the present invention is to provide a method of fabricating an organic ELD device having a dual plate structure that is capable of reducing contact resistance.

Additional advantages, objects, and features of the invention will be set forth in the description which follows, and in part will become apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic ELD device includes a first substrate and a second substrate facing each other and having a plurality of sub-pixels, a gate line and a data line crossing each other and disposed on the first substrate to define one of the plurality of sub-pixels, a driving thin film transistor formed in the one of the plurality of sub-pixels, a passivation layer formed on the driving thin film transistor, at least two contact spacers formed on the passivation layer, a connection electrode connected to a drain electrode of the driving thin film transistor and formed on the contact spacers, a first electrode and an organic luminescent layer sequentially laminated on the second substrate, and a second electrode formed on the organic luminescent layers and contacting the connection electrode by means of the contact spacers.

In another aspect of the present invention, a method for fabricating an organic ELD device comprising forming a gate line and a data line on a first substrate to define a sub-pixel, forming a power line parallel to and spaced apart from the date line, forming a driving thin film transistor where the gate line crosses the power line, forming a passivation layer on the driving thin film transistor, forming at least two contact spacers on the passivation layer, forming a connection electrode on the contact spacers, forming a first electrode, an organic luminescent layer, and a second electrode in a second substrate opposite to the first substrate, and bonding the first substrate to the second substrate such that the connection electrode contacts the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic ELD device according to one exemplary embodiment of the present invention and a method for fabricating the same will be described in detail with reference to the accompanying drawings.

Figure 1:
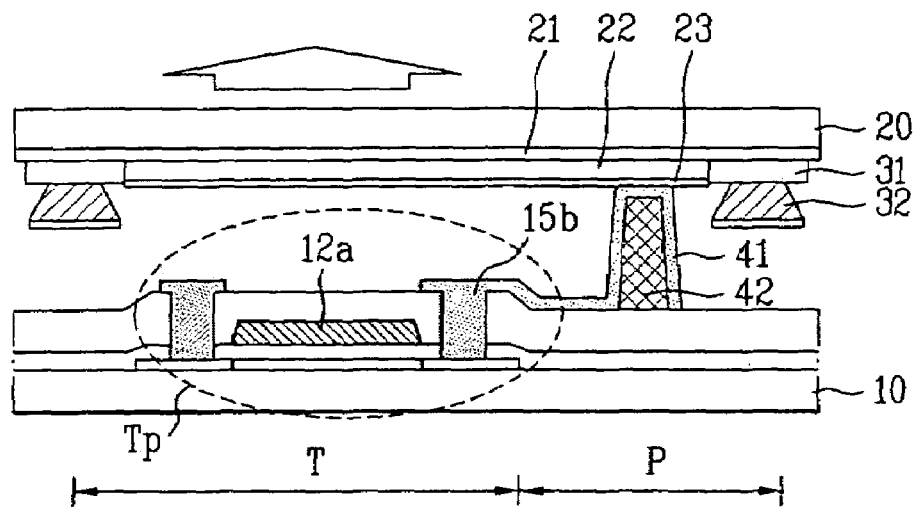
FIG. 1 is a cross-sectional view illustrating an organic ELD device according to the related art.
Figure 2:
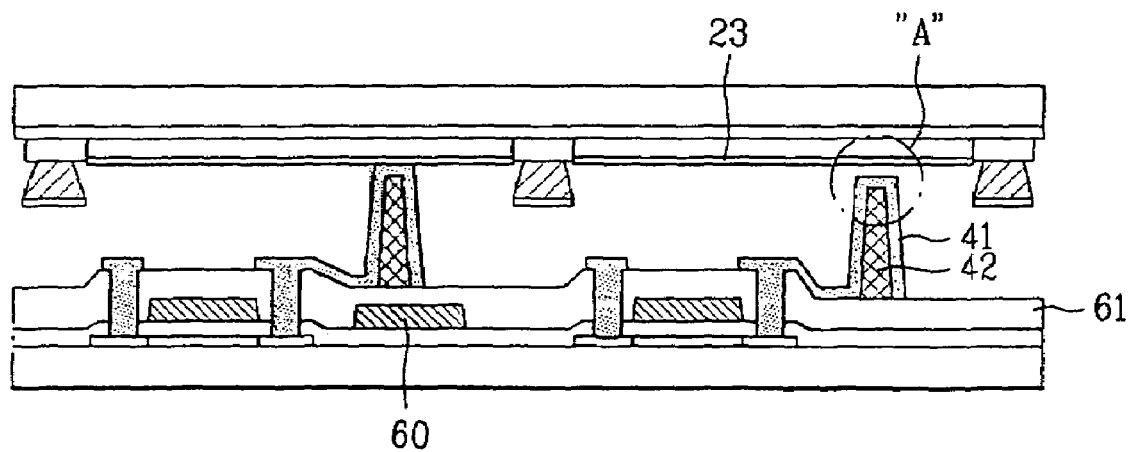
FIG. 2 is a cross-sectional view illustrating problems in the related art organic ELD device of FIG. 1.
Figure 3:
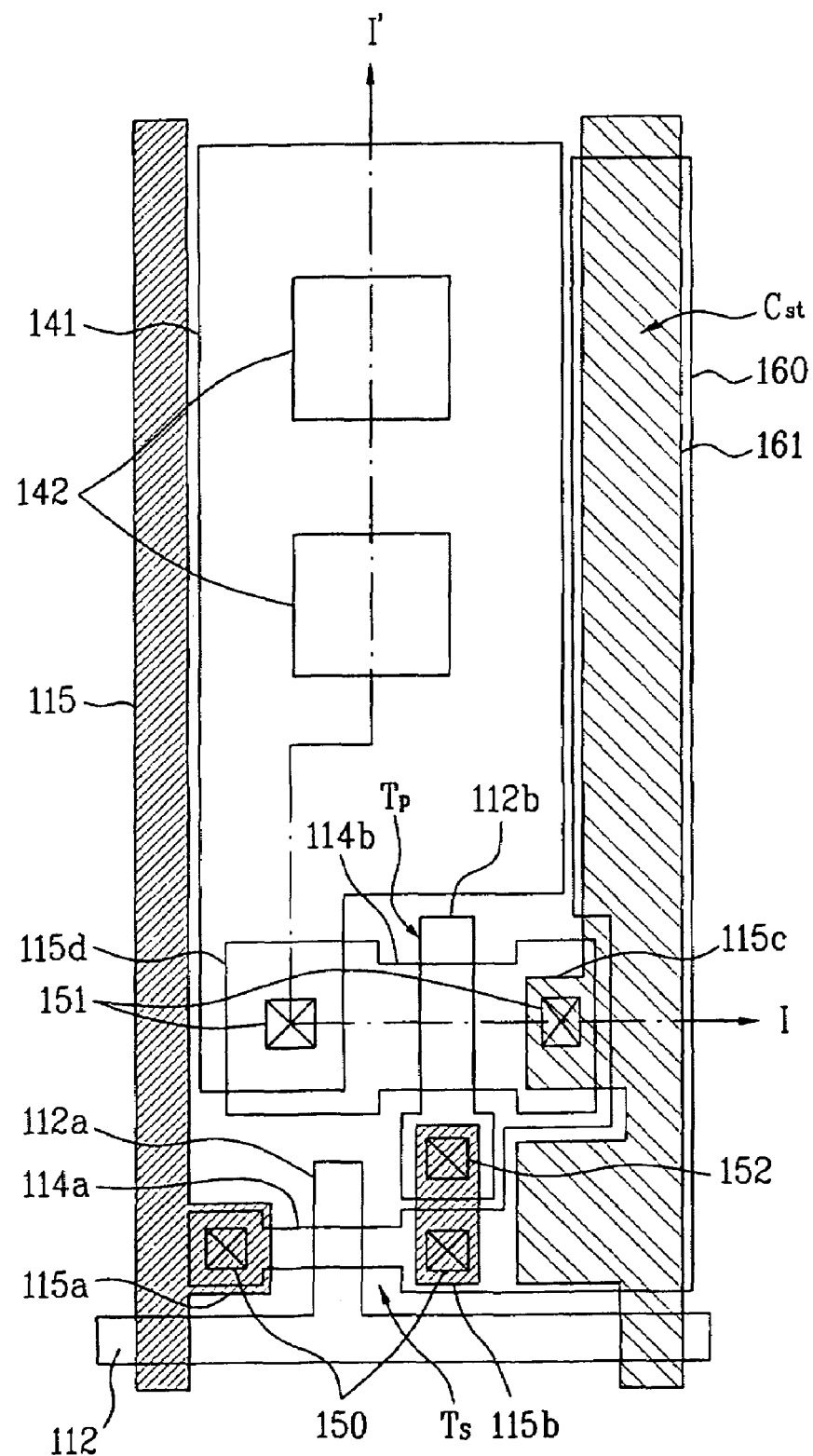
FIG. 3 is a plan view illustrating an organic ELD device according to one exemplary embodiment of the present invention.
Figure 4:
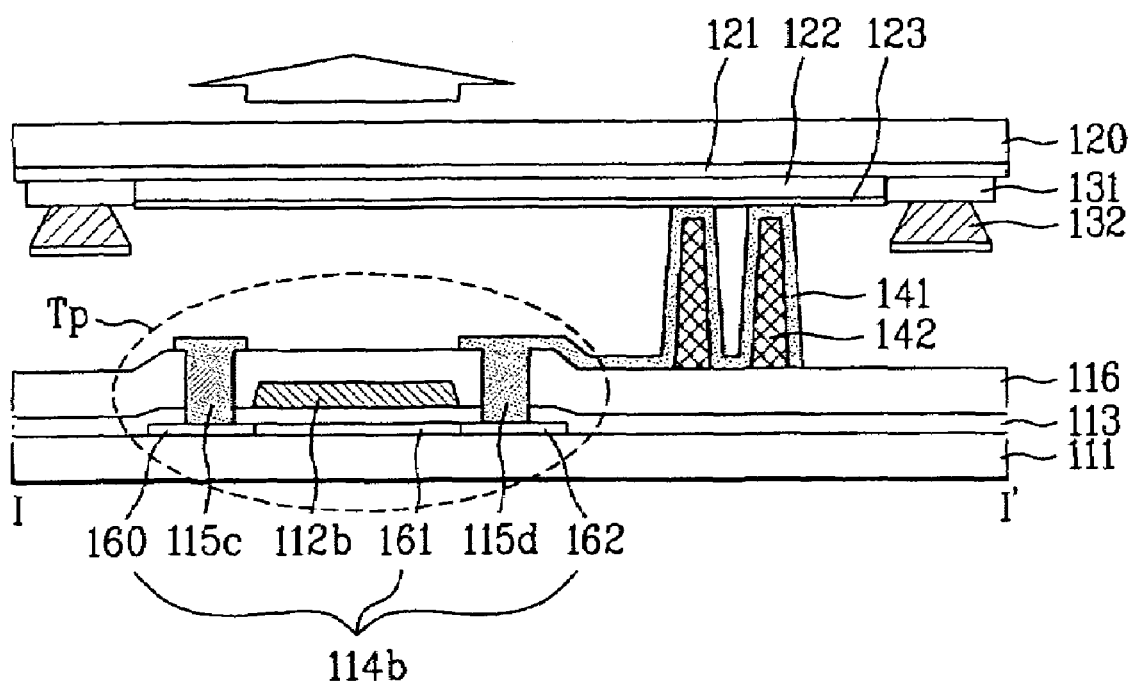
FIG. 4 is a cross-sectional view taken along the line I-I' of FIG. 3.
Figure 5A:
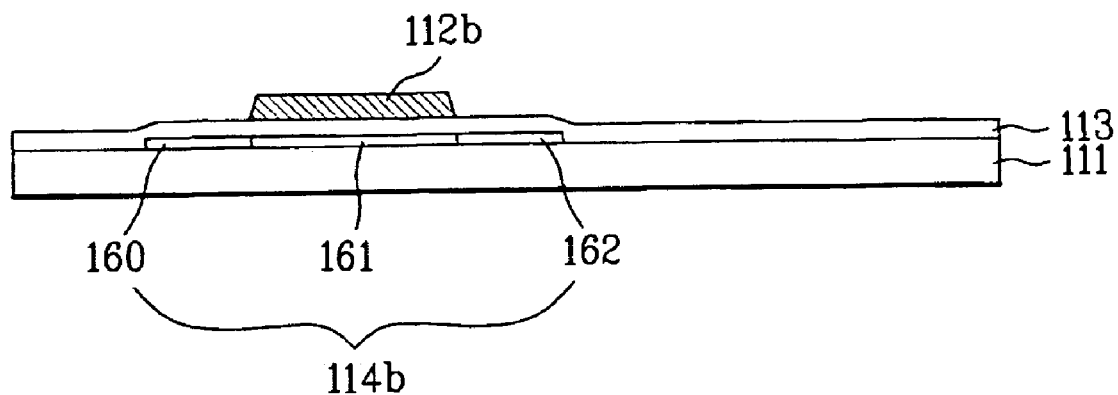
FIGS. 5A to 5D illustrate a manufacturing process of the organic ELD device of FIG. 3.
Figure 5B:
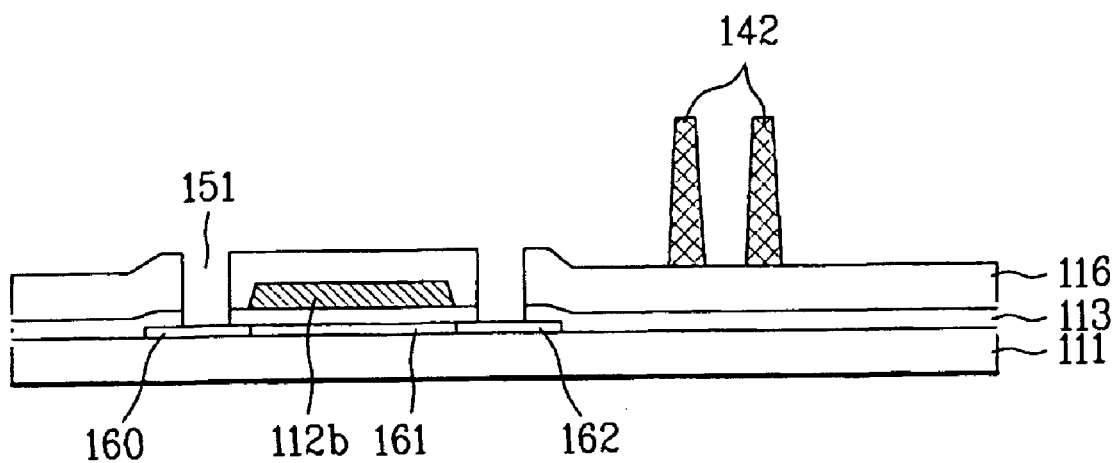
Figure 5C:
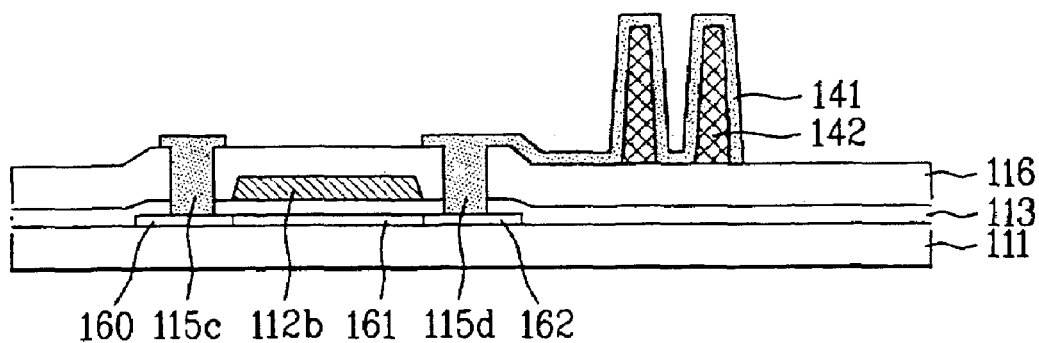
Figure 5D:
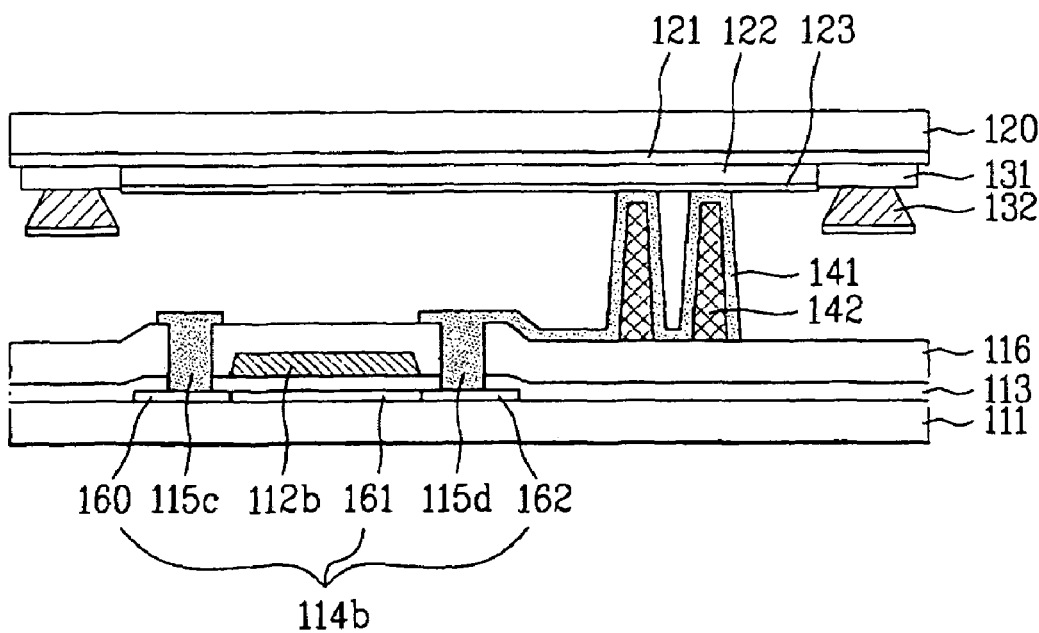
Figure 6:
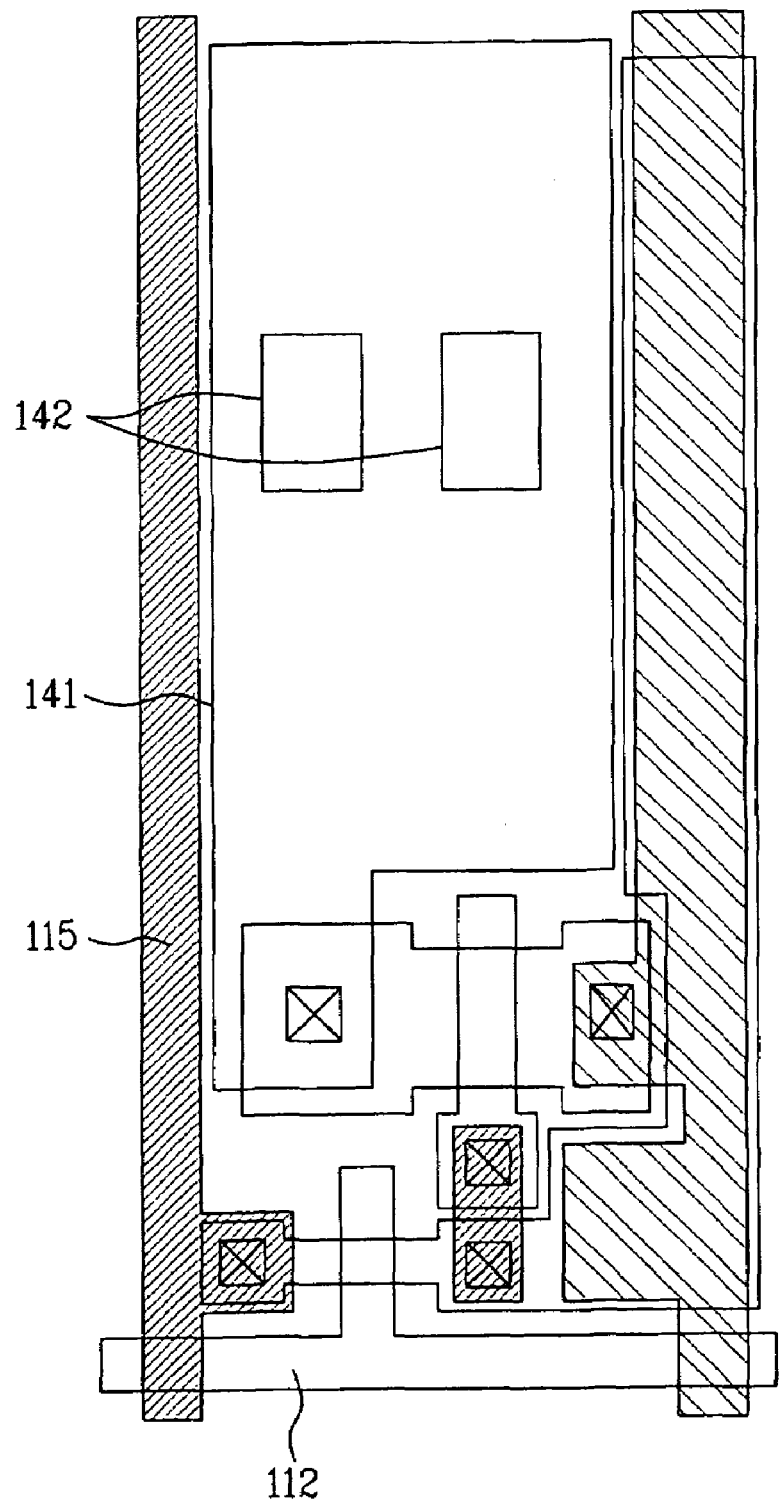
FIG. 6 is a plan view illustrating an organic ELD device according to another exemplary embodiment of the present invention.

FIG. 3 is a plan view illustrating an organic ELD device according to the one exemplary embodiment of the present invention, FIG. 4 is a cross-sectional view taken along the line I-I' of FIG. 3, FIGS. 5A to 5D illustrate a manufacturing process of the organic ELD device of FIG. 3, and FIG. 6 is a plan view illustrating an organic ELD device according to another exemplary embodiment of the present invention.

As shown in FIGS. 3 and 4, the organic ELD device includes a first substrate 111 and a second substrate 120. The first substrate is formed with a thin film transistor array including a switching thin film transistor Ts and a driving thin film transistor Tp. The second substrate 120 is formed with an organic electroluminescent part including a first electrode 121, an organic luminescent layer 122, and a second electrode 123 that are laminated. The thin film transistor array and the organic electroluminescent part are formed on the first and second substrates 111 and 120, respectively, thereby creating a dual plate structure.

The first and second substrates 111 and 120 are electrically connected to each other by a connection electrode 141. The connection electrode 141 is formed in the surfaces of contact spacers 142. At least two contact spacers 142 are formed in a single sub-pixel. Specifically, on the first substrate 111, the sub-pixel is defined by gate lines 112 arranged in a single row, a data line 115 and a power line 161 perpendicularly crossing each other and spaced apart from each other by predetermined intervals.

The switching thin film transistor Ts is disposed where the gate line 112 crosses the data line 115. The driving thin film transistor Tp is disposed where the gate line 112 crosses the power line 161. The switching thin film transistor Ts and driving thin film transistor Tp respectively include gate electrodes 112a and 112b, active layers 114a and 114b, source electrodes 115a and 115c, and drain electrodes 115b and 115d.

In this exemplary embodiment, if the active layers 114a and 114b are formed of poly-crystalline silicon, the switching thin film transistor Ts and the driving thin film transistor Tp are top-gate type thin film transistors in which the gate electrodes are disposed in the upper sides thereof. As shown in FIG. 4, the source electrode 115c and the drain electrode 115d of the driving thin film transistor Tp are respectively connected to a source region 160 and a drain region 162 of the active layer 114b. The active layer 114b between the source region 160 and the drain region 162 become a channel layer. This structure is equally applied to the switching thin film transistor Ts.

However, the active layers 114a and 114b may be formed of amorphous silicon. In this exemplary embodiment, the driving thin film transistor Tp becomes a bottom-gate type thin film transistor in which the gate electrode 112b is disposed in the lower side thereof. The gate electrode 112a of the switching thin film transistor Ts is integrally formed with the gate line 112. The source electrode 115a of the switching thin film transistor Ts is integrally formed with the data line 115. The drain electrode 115b of the switching thin film transistor Ts is provided in the same layer as that of the data line 115 and connected to the gate electrode 112b of the driving thin film transistor Tp via a contact hole 152. The gate electrode 112b of the driving thin film transistor Tp is provided in the same layer as that of the gate line 112. The source electrode 115c of the driving thin film transistor Tp is connected to the power line 161. The drain electrode 115d of the driving thin film transistor Tp is connected to the connection electrode 141. The connection electrode 141 contacts the second electrode 123.

The connection electrode 141 is formed on the surface of the contact spacers 142. In this exemplary embodiment, the contact spacers 142 are arranged on a passivation layer 116. Also, the contact spacers 142 are formed with pillar-shaped organic patterns by photo etching using photoresist, and organic insulating material such as photoacryl, polyimide, and the like. Moreover, the contact spacers 142 have the same height as the cell gap between the first substrate 110 and the second substrate 120. In order to increase contact area between the connection electrode 141 and the second electrode 123, at least two contact spacers 142 are formed in a single sub-pixel. Such an arrangement increases the contact area between the connection electrode 141 and the second electrode 123, thereby reducing poor contact due to unevenness of a step in the sub-pixel as well as contact resistance.

The contact spacers 142 are formed in a region within the sub-pixel where the thin film transistors are not formed. As shown in FIG. 3, more than two contact spacers 142 may be arranged in a direction parallel to the data line 115. As shown in FIG. 6, more than two contact spacers 142 may be arranged in a direction parallel to the gate line 112. Moreover, the power line 161 and a storage electrode 160, overlapped with the power line 161 at the lower side of the power line 161, interpose an insulation layer including a gate insulating layer 113 and a passivation layer 116 to form a storage capacitor Cst. The power line 161 is provided in the same layer as that of the data line 115. The storage electrode 160 is provided in the same layer as that of the active layer 114b of the thin film transistor.

On the second substrate 120, the first electrode 121 is formed as a transparent hole-injection layer. On the first electrode 121, the organic luminescent layers 122 are independently deposited in every sub-pixel. On the organic luminescent layers 122, the second electrodes 123 are laminated as the electron-injection layer. Also, on the first electrode 121, an insulation layer 131 and trapezoidal separators 132 are sequentially formed in the boundary of the sub-pixel. By the separators 132, the organic luminescent layers 122 and the second electrode 123 are formed in a unit of the sub-pixel without a separate patterning process. The separators 132 are formed in the boundary of the sub-pixels to have a frame structure. The organic luminescent layer 122 includes a hole-injection layer and a hole-transporting layer near the first electrode 121, a main luminescent layer whose respective sub-pixels emit specific colored light, an electron-injection layer and an electron-transporting layer near the second electrode 123. The organic materials for emitting red-, green-, and blue-colored lights are patterned in every sub-pixel such that colors of red R, green G, and blue B are expressed.

Hereinafter, the method for fabricating the organic ELD device according to the preferred embodiment of the present invention will be described with reference to FIGS. 5A to 5D.

As shown in FIG. 5A a polysilicon layer is deposited on the first substrate 111 and then is patterned to form the active layer 114b, by either a method of directly depositing polysilicon or a method of crystallizing in poly-crystals after depositing amorphous silicon in the method of forming the polysilicon layer. After that, a silicon oxide ($SiO_2$) may be further formed as a buffer layer (not shown) on a front side between the first substrate 111 and the active layer 114b. The buffer layer serves to prevent mobile charge from permeating from the substrate to the active layer during a post process and a self-heating effect of the organic ELD device. Further the buffer layer serve to protect the substrate from high temperature during the crystallizing process of the amorphous silicon layer and to improve a contact property of the active layer with respect to the substrate.

Next, as shown in FIG. 5A, silicon nitride or silicon oxide is deposited on the front side containing the active layer 114b to form a gate insulation layer 113. To prevent a signal delay, a low-resistance metal is deposited and patterned to form the gate electrode 112b and the gate line 112 (See FIG. 3) on the gate insulation layer 113. The gate electrode 112b is overlapped with a predetermined region of the active layer 114b.

As shown in FIG. 5B, using the gate electrode 112b as a mask, high-density n-type impurity ions or high-density p-type impurity ions are doped on the active layer 114b to form the source and drain regions 160 and 162. The active layer 114b between the source region 160 and the drain region 162, in which the impurity ions are not doped by the gate electrode 112b, becomes the channel layer 161. Next, an inorganic material or an organic material is formed in the front side containing the gate electrode 112b to form the passivation layer 116. After that, the gate insulation layer 113 and the passivation layer 116 are etched to form the contact holes 151 such that the source region 160 and the drain region 162 are exposed. Then, on the passivation layer 116, benzocyclobutene and acryl resin as an organic material are heavily coated and patterned to form the pillar-shaped contact spacers 142. In the exemplary embodiment, at least two contact spacers 142 are formed in a single sub-pixel. A plurality of contact spacers 142 are arranged in a direction parallel to the gate line or in a direction parallel to the data line. The contact spacers 142 are formed in the sub-pixels in which the driving thin film transistor Tp and the switching thin film transistor Ts are not formed.

As shown in FIG. 5C, a low-resistance metal layer is deposited on the front side containing the contact spacers 142, and a patterning process entailing wet etching is performed to form the source/drain electrode 115c and 115d and the data line 115 (See FIG. 3) respectively contacting the source region 160 and the drain region 162 through the contact holes 151. Simultaneously, the connection electrode 141 is deposited on the contact spacers 142 and connected to the drain electrode 115d. Moreover, the data line, the source/drain electrode of the driving thin film transistor, and the connection electrode may be formed simultaneously in the same layer, or independently in separate layers. The power line 161 (See FIG. 3) may be further formed simultaneously with the data line. The power line 161 may be formed in a separate layer in a separate process. However, the source electrode 115c of the driving thin film transistor Tp contacts the power line 161.

The top-gate type driving thin film transistor Tp having a laminated layer including the active layer 114b, the gate insulation layer 113, the gate electrode 112b, the source electrode 115c, and the drain electrode 115d is thus completed. These processes are identical to those of the switching thin film transistor Ts.

As shown in FIG. 5D, the second substrate 120 in which the first electrode 121, the organic luminescent layer 122, the second electrode 123, the separator 132 are formed is oppositely bonded to the first substrate 111 such that the connection electrode 141 of the first substrate 111 contacts the second electrode 123 of the second substrate 120. Since at least two contact spacers 142 are formed in a single sub-pixel, the contact area between the connection electrode 141 and the second electrode 123 is increased, thereby reducing the contact resistance.

The organic ELD device according to the exemplary embodiment of the present invention and the method for fabricating the same have advantages as follows. Since at least two contact spacers are formed in a single sub-pixel to increase the contact area between the connection electrode and the second electrode, the poor contact due to unevenness of the lower layer in the sub-pixels can be reduced, and the increased contact area can further reduce the contact resistance.

It will be apparent to those skilled in the art that various modifications and variations can be made in the organic ELD device and the method of fabricating the same in the present invention without departing from the spirit or scope of the inventions. Thus, it is intended that the present invention covers the modifications and variations of this invention provided they come within the scope of the appended claims and their equivalents

What is claimed is:

1. An organic electroluminescent display (ELD) device comprising:
    a first substrate and a second substrate facing each other and including a plurality of sub-pixels;
    a gate line and a data line disposed on a first substrate and crossing to define one of the plurality of sub-pixels;
    a driving thin film transistor formed in the one of the plurality of sub-pixels;
    a passivation layer formed on the driving thin film transistor;
    at least two contact spacers formed on the passivation layer in a single sub-pixel;
    a connection electrode formed on the at least two contact spacers and connected to a drain electrode of the driving thin film transistor;
    a first electrode and an organic luminescent layer sequentially laminated on the second substrate; and
    a second electrode formed on the organic luminescent layers and contacting the connection electrode by means of the contact spacers.

2. The organic ELD device according to claim 1, wherein the at least two contact spacers are arranged in a direction parallel to one of the gate line and the data line.

3. The organic ELD device according to claim 1, wherein the driving thin film transistor is a top-gate type.

4. The organic ELD device according to claim 1, further comprising a power line spaced apart from the data line by predetermined distance.

5. The organic ELD device according to claim 4, wherein the driving thin film transistor includes a source electrode connected to the power line.

6. The organic ELD device according to claim 4, wherein the power line is formed on the same layer as the data line.

7. The organic ELD device according to claim 4, further comprising a storage electrode overlapped with the power line at a lower side of the power line to form a storage capacitor.

8. The organic ELD device according to claim 7, wherein the storage electrode is formed on the same layer as an active layer of the driving thin film transistor.

9. The organic ELD device according to claim 4, further comprising a switching thin film transistor formed where the gate line crosses the data line.

10. The organic ELD device according to claim 9, wherein the switching thin film transistor is a top-gate type.

11. The organic ELD device according to claim 9, wherein the switching thin film transistor includes a source electrode connected to the data line, and a drain electrode connected to a gate electrode of the driving thin film transistor.

12. The organic ELD device according to claim 1, further comprising a separator dividing both of the organic luminescent layer and the second electrode so that they are formed in each of the plurality of sub-pixels.

* * * * *